United States Patent
Nishimura et al.

(10) Patent No.: US 10,192,741 B2
(45) Date of Patent: Jan. 29, 2019

(54) DEVICE SUBSTRATE, METHOD OF MANUFACTURING DEVICE SUBSTRATE, AND METHOD OF MANUFACTURING SEMICONDUCTOR DEVICE

(71) Applicant: Toshiba Memory Corporation, Minato-ku (JP)

(72) Inventors: Takahito Nishimura, Kuwana (JP); Yoshihisa Kawamura, Yokkaichi (JP); Kazuhiro Takahata, Kuwana (JP); Ikuo Yoneda, Yokkaichi (JP); Yoshiharu Ono, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/696,458

(22) Filed: Sep. 6, 2017

(65) Prior Publication Data
US 2017/0365470 A1 Dec. 21, 2017

Related U.S. Application Data

(62) Division of application No. 15/010,041, filed on Jan. 29, 2016, now Pat. No. 9,793,120.

(30) Foreign Application Priority Data

Jun. 16, 2015 (JP) .................................. 2015-121543

(51) Int. Cl.
*H01L 21/033* (2006.01)
*G03F 7/00* (2006.01)

(52) U.S. Cl.
CPC ........ *H01L 21/0334* (2013.01); *G03F 7/0002* (2013.01)

(58) Field of Classification Search
CPC .......... H01L 21/78–21/786; H01L 2224/1357; H01L 21/7684;
(Continued)

(56) References Cited

U.S. PATENT DOCUMENTS 6,781,244 B2   8/2004   Prabhu
7,137,803 B2   11/2006  Chou
(Continued)

FOREIGN PATENT DOCUMENTS

JP   2001-230166   8/2001
JP   2002-93748    3/2002
(Continued)

*Primary Examiner* — Thanh Y Tran
(74) *Attorney, Agent, or Firm* — Oblon, McClelland, Maier & Neustadt, L.L.P.

(57) ABSTRACT

According to one embodiment, a device substrate includes a multilayer film that includes a film constituting a device element and is disposed on a substrate. A main face on which the device element is disposed includes a patterning region on which a resist is to be applied during an imprint process, and a bevel region provided as a region from a peripheral edge portion of the patterning region to an end portion of the device substrate. The bevel region includes a region where an upper surface of the bevel region becomes lower toward the end portion of the device substrate relative to an upper surface of the patterning region. The upper surface of the bevel region has an inclination angle of 10° or more and 90° or less with respect to the upper surface of the patterning region, at a boundary between the patterning region and the bevel region.

9 Claims, 6 Drawing Sheets (58) Field of Classification Search
CPC .. H01L 21/76841–21/76876; H01L 23/53223; H01L 2224/1355–2224/13553; H01L 2224/13541; H01L 24/02–24/16
See application file for complete search history.

(56) References Cited

U.S. PATENT DOCUMENTS

| | | |
|---|---|---|
| 7,662,670 B2 | 2/2010 | Noma |
| 7,935,568 B2 | 5/2011 | Oganesian |
| 8,556,616 B2 | 10/2013 | Resnick et al. |
| 8,598,720 B2 | 12/2013 | Tomita |
| 8,632,720 B2 | 1/2014 | Zhang et al. |
| 9,006,865 B2 | 4/2015 | Ikuta et al. |
| 2003/0230805 A1 | 12/2003 | Noma |
| 2004/0046288 A1 | 3/2004 | Chou |
| 2004/0120644 A1 | 6/2004 | Chou et al. |
| 2008/0106003 A1 | 5/2008 | Chou |
| 2008/0160129 A1 | 7/2008 | Resnick et al. |
| 2010/0236705 A1 | 9/2010 | Chou |
| 2010/0291257 A1 | 11/2010 | Resnick et al. |
| 2011/0273684 A1 | 11/2011 | Owa et al. |
| 2015/0099357 A1* | 4/2015 | Shiu .................... H01L 21/6835 438/613 |
| 2016/0013159 A1* | 1/2016 | Kwon ................ H01L 25/0657 257/627 |

FOREIGN PATENT DOCUMENTS

| | | |
|---|---|---|
| JP | 2004-504718 | 2/2004 |
| JP | 2006-24840 | 1/2006 |
| JP | 2007-214256 | 8/2007 |
| JP | 5139421 | 2/2013 |
| WO | WO 2009/153925 A1 | 12/2009 |
| WO | WO 2011/161975 A1 | 12/2011 |

* cited by examiner

DEVICE SUBSTRATE, METHOD OF MANUFACTURING DEVICE SUBSTRATE, AND METHOD OF MANUFACTURING SEMICONDUCTOR DEVICE

CROSS-REFERENCE TO RELATED APPLICATIONS

This application is a division of and claims the benefit of priority under 35 U.S.C. § 120 from U.S. application Ser. No. 15/010,041 filed Jan. 29, 2016, and claims the benefit of priority under 35 U.S.C. § 119 from Japanese Patent Application No. 2015-121543 filed Jun. 16, 2015; the entire contents of each of which are incorporated herein by reference.

FIELD

Embodiments described herein relate generally to a device substrate, a method of manufacturing a device substrate, and a method of manufacturing a semiconductor device.

BACKGROUND

According to a nano-imprint technique, a template is placed adjacent to a semiconductor wafer including a resist dropped thereon, such that rugged patterns formed on the main face of the template on the semiconductor wafer side are filled with the resist, and then the resist is cured. Then, the template is separated, so that rugged patterns are formed on the semiconductor wafer.

At imperfect shot areas where part of the template is present outside the semiconductor wafer, the bevel surface is poor in flatness, and so the bevel surface is in different states at respective shot positions. Consequently, a film thickness difference is generated in the thickness of the resist between the template and the semiconductor wafer (this thickness will be referred to as RLT). When the template is moved relative to the semiconductor wafer in a lateral direction during die-by-die alignment, the template comes into contact with the RLT at an adjacent imperfect shot area, which has already been cured, and a shear force is thereby generated on the template and the semiconductor wafer. Further, along with a decrease in the RLT, the resist comes to behave as an elastic body, and thereby increases the shear force acting on the template and the semiconductor wafer. Accordingly, the flatness of the bevel surface has a great influence on the shear force generated during the die-by-die alignment.

Furthermore, at the imperfect shot areas, the template has a large deformation amount by itself, and the deformation amount of the template is hard to estimate. As a result, this problem causes deterioration of the overlay accuracy between the semiconductor wafer and the imprint patterns.

DETAILED DESCRIPTION

In general, according to one embodiment, a device substrate includes a multilayer film that includes a film constituting a device element and is disposed on a substrate. A main face of the device substrate on which the device element is disposed includes a patterning region on which a resist is to be applied during an imprint process, and a bevel region provided as a region from a peripheral edge portion of the patterning region to an end portion of the device substrate. The bevel region includes a region where an upper surface of the bevel region becomes lower toward the end portion of the device substrate relative to an upper surface of the patterning region. The upper surface of the bevel region has an inclination angle of 10° or more and 90° or less with respect to the upper surface of the patterning region, at a boundary between the patterning region and the bevel region.

An exemplary embodiment of a device substrate, a method of manufacturing a device substrate, and a method of manufacturing a semiconductor device will be explained below in detail with reference to the accompanying drawings. The present invention is not limited to the following embodiment. The sectional views of a device substrate used in the following embodiment are schematic, and so the relationship between the thickness and width of each layer and/or the thickness ratios between respective layers may be different from actual states.

Figure 1:
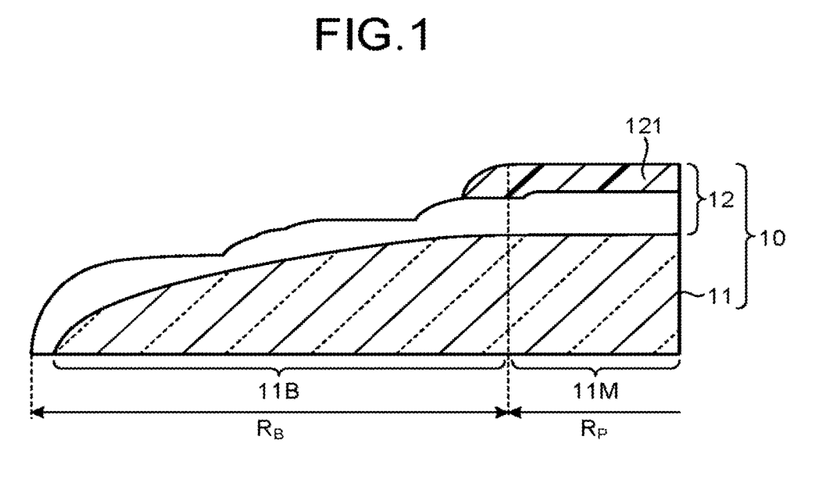
FIG. 1 is a partial sectional view schematically showing a structural example of a device substrate according to an embodiment.

FIG. 1 is a partial sectional view schematically showing a structural example of a device substrate according to an embodiment. The device substrate 10 has a structure in which a multilayer film 12 composed of a plurality of films forming device elements is formed on a semiconductor wafer 11 serving as a substrate. The device substrate 10 includes a patterning region $R_P$ and a bevel region $R_B$, both of which are present on a face side forming device elements.

The patterning region $R_P$ is a region having a circular disk shape, on which a resist is to be applied during an imprint process. The patterning region $R_P$ is also a region on which a template is to be pressed during an imprint process to form device elements thereon. The upper surface of the patterning region $R_P$ is flat, and so it has the same height at any position within the patterning region $R_P$. Further, on the patterning region $R_P$, the uppermost layer film of the multilayer film 12 is a mask film 121, or a stacked film composed of the mask film 121 and an adhesion film (not shown). The mask film 121 is formed of an SOC (Spin On Carbon) film or the like, for example, where the SOC film is a coating type carbon film.

The bevel region $R_B$ is present on the outer peripheral side of the patterning region $R_P$. On the bevel region $R_B$, the upper surface of the device substrate 10 is lower at a position corresponding to the end portion of the device substrate 10 than at a position corresponding to the boundary between the bevel region $R_B$ and the patterning region $R_P$. This upper surface may be continuously inclined from the boundary between the bevel region $R_B$ and the patterning region $R_P$ toward the end portion, or it may be shaped such that its height decreases stepwise through step portions respectively formed with round surfaces. On the bevel region $R_B$, except for the part near the boundary with the patterning region $R_P$, there is not formed the mask film 121, nor the stacked film composed of the mask film 121 and an adhesion film, which is disposed as the uppermost layer on the patterning region $R_P$. In other words, according to this embodiment, the multilayer film 12 on the bevel region $R_B$ has a structure that a predetermined number of layer films from the uppermost layer of the multilayer film 12 on the patterning region $R_P$ are removed.

As described above, the device substrate 10 has a structure in which the multilayer film 12 is formed on the semiconductor wafer 11. The semiconductor wafer 11 includes a wafer main body 11M having a circular disk shape, and a bevel section 11B having a round shape and provided on the peripheral edge portion of the wafer main body 11M. The patterning region $R_P$ of the device substrate 10 is present as a region corresponding to the wafer main body 11M of the semiconductor wafer 11. Further, the bevel region $R_B$ of the device substrate 10 is present as a region corresponding to the bevel section 11B of the semiconductor wafer 11. Here, as the semiconductor wafer 11, a single crystalline silicon wafer may be used, or a germanium wafer, gallium arsenide wafer, indium phosphide wafer, or indium arsenide wafer may be used instead. Further, the substrate is exemplified by the semiconductor wafer 11, but a glass wafer or ceramic wafer may be used instead.

The multilayer film 12 is formed on one of the main face sides of the semiconductor wafer 11. For example, the multilayer film 12 includes a metal film, a semiconductor film, and/or an insulating film, which are stacked and used for constituting device elements. Further, the multilayer film 12 may include other films, such as a mask film, necessary for forming device elements. The multilayer film 12 is formed not only on the wafer main body 11M but also on the bevel section 11B. However, on the bevel section 11B, each of the films in the multilayer film 12 is set to be excluded or not excluded, depending on the type of the film. Consequently, the bevel region $R_B$ of the device substrate 10 has a stepwise shape formed with round surfaces as shown in FIG. 1.

Figure 2A:
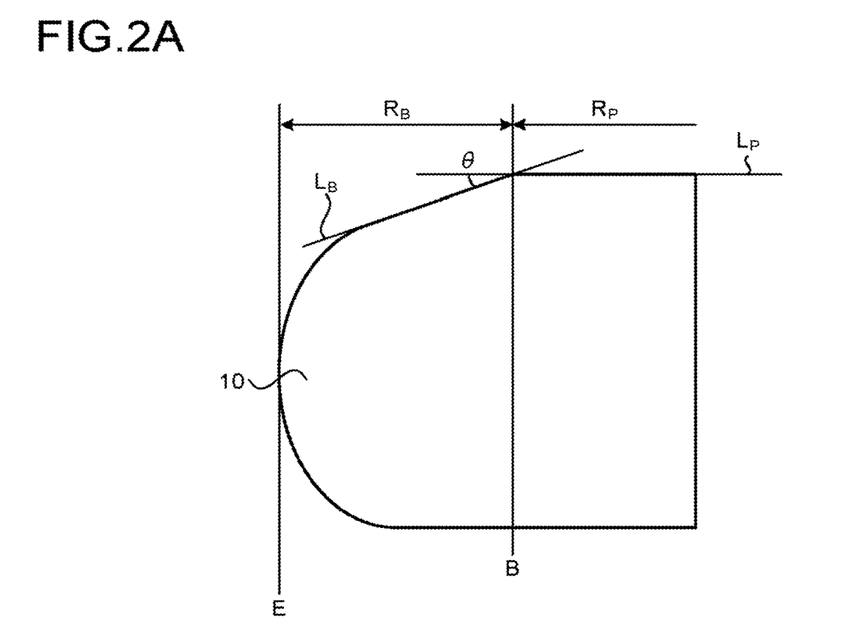
FIGS. 2A and 2B are sectional views schematically showing a state of inclination of the upper surface of a bevel region with respect to the upper surface of a patterning region, according to the embodiment.
Figure 2B:
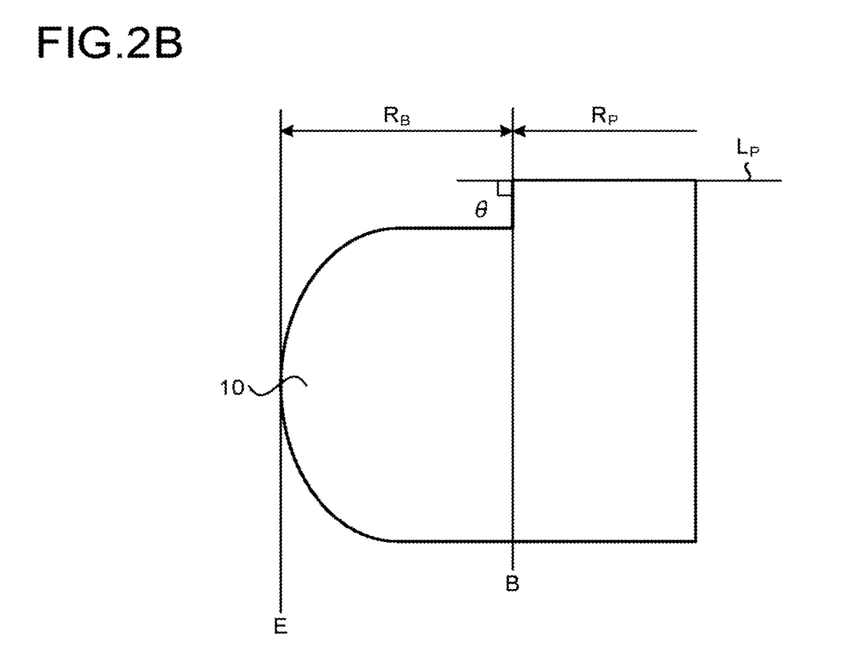

According to this embodiment, at the boundary between the patterning region $R_P$ and the bevel region $R_B$, the upper surface of the bevel region $R_B$ has an inclination angle of 10° or more and 90° or less with respect to the upper surface of the patterning region $R_P$. FIGS. 2A and 2B are sectional views schematically showing a state of inclination of the upper surface of the bevel region with respect to the upper surface of the patterning region, according to the embodiment. FIG. 2A shows a sectional view in a case that the inclination angle is set to an arbitrary angle of 10° or more and 90° or less, and FIG. 2B shows a sectional view in a case that the inclination angle is set to 90°.

As shown in FIG. 2A, it is assumed that $L_P$ denotes a straight line extending along the upper surface of the patterning region $R_P$ of the device substrate 10, and $L_B$ denotes a straight line extending along the upper surface of the bevel region $R_B$ of the device substrate 10. The angle θ formed on the bevel region $R_B$ by the straight line $L_B$ extending along the upper surface of the bevel region $R_B$ with respect to the straight line $L_P$ extending along the upper surface of the patterning region $R_P$ will be referred to as an inclination angle of the upper surface of the bevel region $R_B$. However, as shown in FIG. 2B, in the case that the inclination angle θ of the upper surface of the bevel region $R_B$ is set to 90°, the upper surface of the patterning region $R_P$ and the upper surface of the bevel region $R_B$ come into a state where they are parallel with each other and have heights different from each other.

If the inclination angle of the upper surface of the bevel region $R_B$ is less than 10°, when the patterning region $R_P$ is planarized by an imprint process using a resist for the planarization placed on the patterning region $R_P$ as described later, the resist leaks from the patterning region $R_P$ onto the bevel region $R_B$. In this case, the flatness of the patterning region $R_P$ is deteriorated at its peripheral edge portion. Accordingly, the inclination angle of the upper surface of the bevel region $R_B$ is preferably set to 10° or more.

On the other hand, if the inclination angle of the upper surface of the bevel region $R_B$ is more than 90°, the mask film 121 that serves as the uppermost layer of the multilayer film 12 comes to have a shape as if the portion below it is scooped out. The mask film 121 having this shape is undesirable, because, when it is used for performing an etching process, the peripheral edge portion of the patterning region $R_P$ is etched in a different state as compared with the other regions of the patterning region $R_P$. Accordingly, the inclination angle of the upper surface of the bevel region $R_B$ is preferably set to 90° or less.

Further, the distance from the end portion E of the device substrate 10 to the boundary B between the bevel region $R_B$ and the patterning region $R_P$ (i.e., to the peripheral edge portion of the patterning region $R_P$) differs depending on the size of an employed template. In addition, this distance is set in consideration of deformation amounts of the template in the thickness direction, which are generated when an imprint process is performed by use of the template at the imperfect shot areas. For example, in the case of a template having a size about 30 mm, this distance is preferably set to 3 mm or less.

Figure 3A:
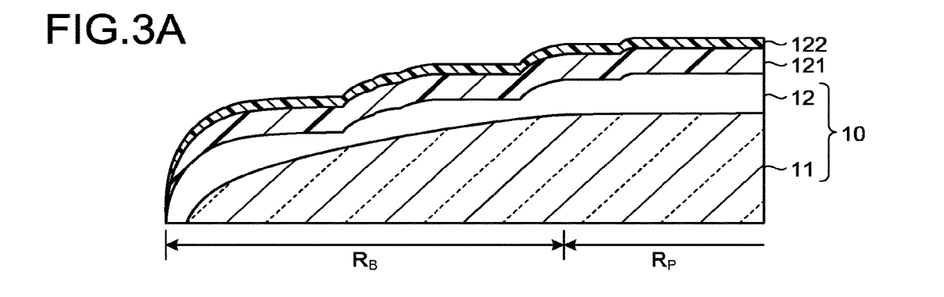
FIGS. 3A to 3G are partial sectional views schematically showing an example of the sequence of a method of manufacturing a device substrate according to the embodiment.

Next, an explanation will be given of a method of manufacturing a semiconductor device, which includes a method of manufacturing the device substrate 10 described above. FIGS. 3A to 3G are partial sectional views schematically showing an example of the sequence of a method of manufacturing a device substrate according to the embodiment. At first, as shown in FIG. 3A, a mask film 121, which can provide a process selection ratio with respect to a process object, is formed on the entire surface of a device substrate 10. The mask film 121 is a film that serves as a mask when the patterning region $R_P$ is subjected to patterning with a desired shape. The mask film 121 is formed of an organic film, such as an SOC film, for example. In this embodiment, an adhesion film 122 is further formed on the mask film 121 and is used to adhere a template to the mask film 121 when an imprint process is performed in a subsequent step. Here, the process object is part or all of the multilayer film 12 formed on the patterning region $R_P$ of the device substrate 10. Further, the type of the multilayer film 12 is arbitrary.

Figure 3B:
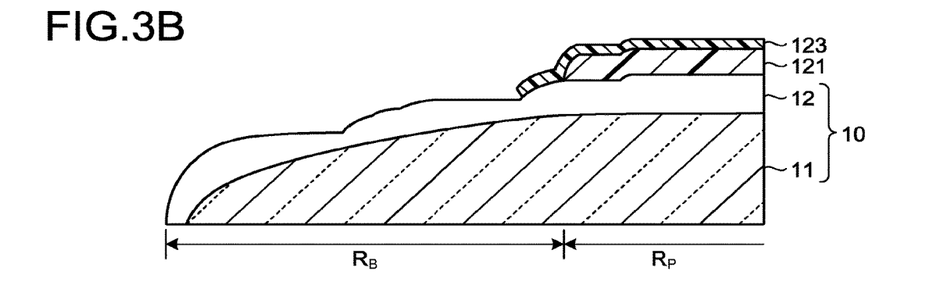

Then, as shown in FIG. 3B, the mask film 121 and the adhesion film 122 are removed at part present on the bevel region $R_B$. This removal of the mask film 121 and the adhesion film 122 may be performed by use of an application of a bevel CMP (Chemical Mechanical Polishing) method, bevel RIE (Reactive Ion Etching), EBR (Edge Bead Removal), or peripheral light exposure. In the case of the bevel CMP method, the bevel region $R_B$ is polished by a polishing pad placed in contact with the bevel region $R_B$, and thereby the mask film 121 and the adhesion film 122 are removed. Alternatively, in the case of the bevel RIE, since the etching region can be controlled by changing the Pez Ring, etching is performed in a state where only the bevel region $R_B$ is exposed to plasma, and thereby the mask film 121 and the adhesion film 122 are removed. Alternatively, in the case of the EBR, an organic solvent, such as thinner, is supplied to the bevel region $R_B$ to dissolve the mask film 121 and the adhesion film 122, and thereby the mask film 121 and the adhesion film 122 are removed. Here, after the mask film 121 and the adhesion film 122 are removed, an adhesion film 123 is formed on the device substrate 10. Alternatively, in the case of the peripheral light exposure, only the bevel region $R_B$ is exposed to light, and thereby the mask film 121 and the adhesion film 122 are removed.

Since the part of the mask film 121 on the bevel region $R_B$ is removed, a step portion is formed between the patterning region $R_P$ and the bevel region $R_B$, such that it corresponds to the thickness of the mask film 121. Since the step portion is formed in this way, the upper surface of the bevel region $R_B$ comes to be positionally almost the same at the respective imperfect shot areas. As a result, when an imprint process is performed later, a template and the bevel region $R_B$ of the device substrate 10 are suppressed from interfering with each other, and, when planarization of the patterning region $R_P$ is performed later by use of a resist dropped thereon, the resist is suppressed from leaking onto the bevel region $R_B$. Here, in this example, the adhesion film 122 is formed on the mask film 121, and the mask film 121 and the adhesion film 122 are removed at part present on the bevel region $R_B$. However, in the case that the adhesion film 122 is not formed on the mask film 121, only the mask film 121 is removed.

In general, since device elements are formed on the patterning region $R_P$, step portions (device step portions) are generated on the patterning region $R_P$. However, the inside of the patterning region $R_P$ is preferably in a planarized state during an imprint process. Accordingly, as shown in FIGS. 3C and 3D, planarization is performed to remove the device step portions on the patterning region $R_P$.

Figure 3C:
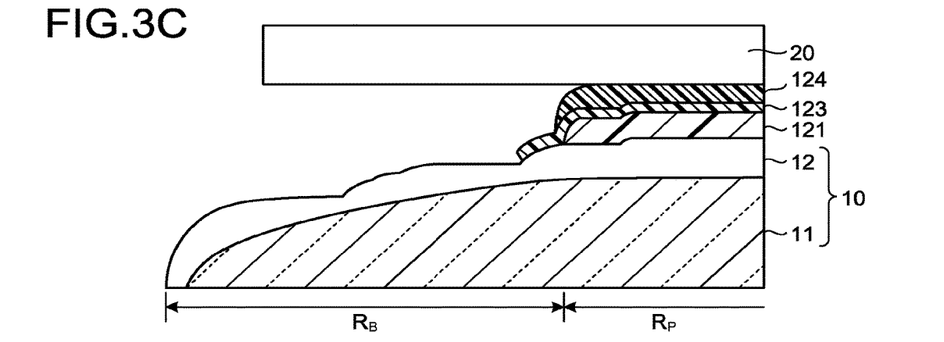

In the example shown in FIG. 3C, an imprint process using a flat blank template 20 is performed to planarize the upper surface of the patterning region $R_P$. More specifically, a resist for the planarization is dropped onto the patterning region $R_P$. For example, the resist is dropped by use of an ink jet method. The resist is made of a photo-curable resin, for example. Then, a blank template 20, which is not formed with any patterns, i.e., which does not include any rugged patterns, is placed adjacent to the upper surface of the patterning region $R_P$ with a predetermined distance therebetween. Thereafter, the resist is irradiated with light having a predetermined wavelength (such as ultraviolet rays), so that the resist is cured. Then, the blank template 20 is separated, and so a resist pattern 124 including the upper surface of the patterning region $R_P$ thus planarized is obtained.

Figure 3D:
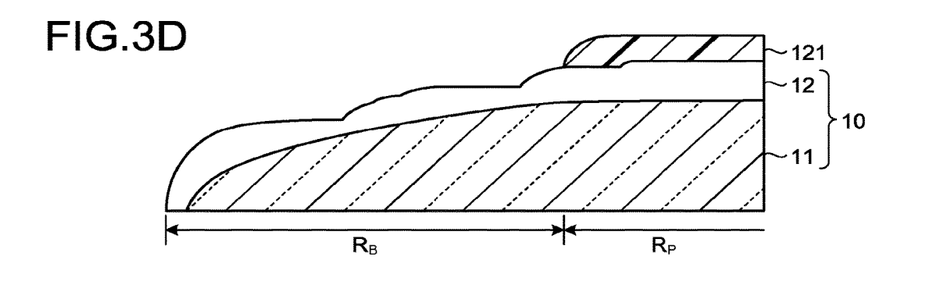

Thereafter, as shown in FIG. 3D, etching back is performed by use of a dry etching method, such as an RIE (Reactive Ion Etching) method. Consequently, the resist pattern 124 and the adhesion film 123 are removed, and the upper surface of the mask film 121 formed on the patterning region $R_P$ of the device substrate 10 is planarized. Further, the upper surface of the bevel region $R_B$ comes to have an inclination angle of 10° or more and 90° or less with respect to the upper surface of the patterning region $R_P$.

Here, the planarization method may be performed by use of a method other than the method using the blank template described above. For example, the upper surface of the mask film on the patterning region $R_P$ may be planarized by use of a CMP method. Alternatively, the upper surface of the mask film on the patterning region $R_P$ may be planarized such that a resist or the like is applied onto the mask film on the patterning region $R_P$ by use of a spin coating method or the like and then etching back is performed by use of a dry etching method or the like.

Figure 3E:
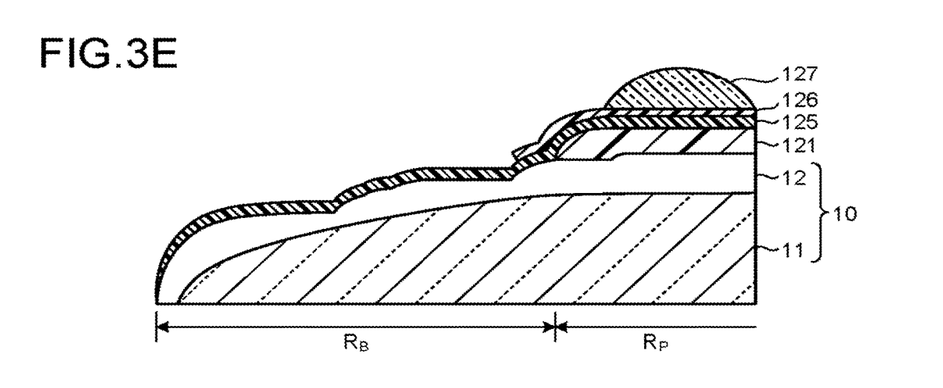

Then, as shown in FIG. 3E, a stacked film 125 and an adhesion film 126 are formed on the device substrate 10, and then a resist 127 is dropped onto the patterning region $R_P$ of the device substrate 10. As the stacked film 125, for example, a stacked film composed of a coating type carbon film and an SOG (Spin On Glass) film may be used. In the case of micro-fabrication processes, scaling in size entails a decrease in resist film thickness, and further an increase in the aspect ratio of process patterns (the ratio between the pattern size and the depth) brings about a micro-loading effect that reduces the etching rate. In this case, the etching time is prolonged, and the resist comes to be set back. Accordingly, the stacked film 12 employed here is composed of a mask and a resist for forming patterns, in which the mask and the resist are respectively made of materials of different types, so that the micro-loading effect described above can be suppressed.

Figure 3F:
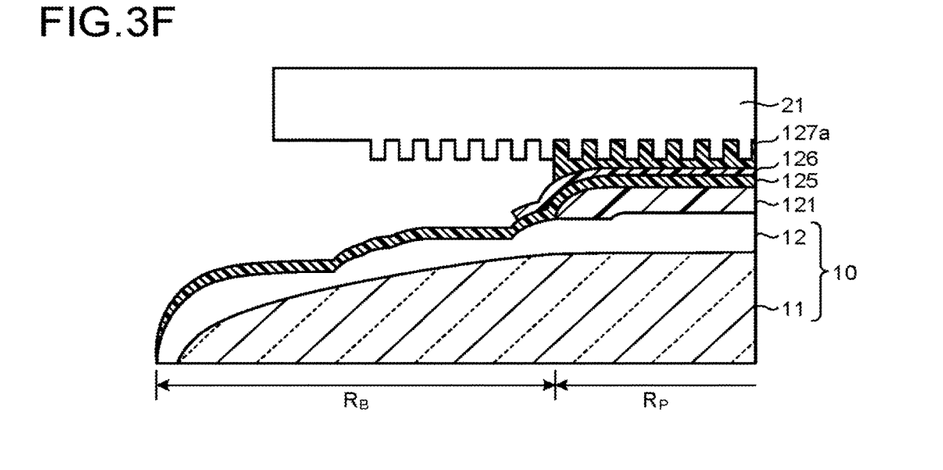

Thereafter, as shown in FIG. 3F, a template 21 formed with rugged patterns is placed on a shot region of the patterning region $R_P$ including the resist 127 dropped thereon, such that there is a predetermined distance between the face formed with the rugged patterns of the template 21 and the upper surface of the device substrate 10. The predetermined distance is set to a certain distance or less, by which the resist 127 can come into contact with the template 21.

Then, the shot region and the template 21 are more accurately positioned by use of die-by-die alignment. The upper surface of the bevel region $R_B$ has a shape controlled such that the upper surface of the bevel region $R_B$ has an angle of 10° or more and 90° or less with respect to the upper surface of the patterning region $R_P$ over the entire periphery of the device substrate 10. Further, the mask film 121 is removed at part present on the bevel region $R_B$. Thus, there is no structural body on the bevel region $R_B$, which disturbs movement of the template 21. Consequently, when the device substrate 10 and the template 21 are moved relative to each other in a direction parallel with the substrate surface, it is possible to reduce the shear force generated on the device substrate 10 and the template 21, and thereby to improve the overlay accuracy. Further, during an imprint process, it is possible to prevent the template 21 from coming into contact with bevel region $R_B$, and thereby to prevent the template 21 from interfering with the device substrate 10.

Figure 3G:
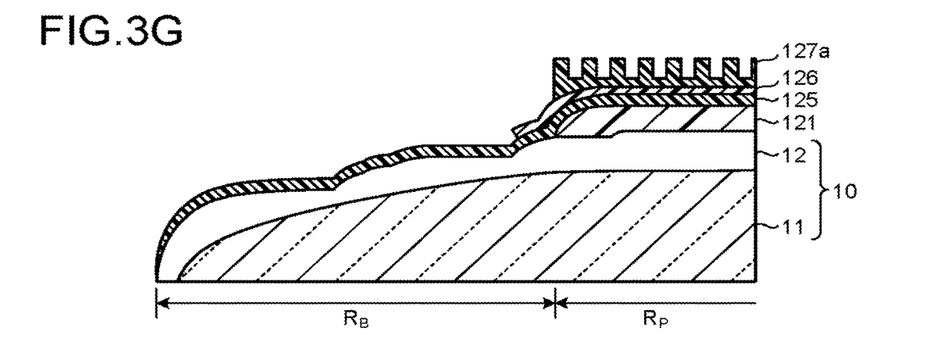

After the recessed portions of the template 21 are filled with the resist 127 by means of a capillary phenomenon, the resist 127 is irradiated with light having a predetermined wavelength, so that the resist 127 is cured. Then, the template 21 is separated. Consequently, as shown in FIG. 3G, resist patterns 127a are formed of recessed and protruded portions reversed from those formed on the template 21. After the resist patterns 127a are formed on all the shot regions, patterning is performed to the mask film 121 by use of a dry etching method, through the resist patterns 127a serving as a mask. Further, etching is performed to a process object included in the multilayer film 12 by use of a dry etching method, through the patterned mask film 121 serving as a mask. As a result, the method of manufacturing a semiconductor device is completed.

Next, an explanation will be given of an effect of the embodiment as compared with a comparative example. FIGS. 4A to 4E are partial sectional views schematically showing an example of the sequence of a pattern formation method according to a comparative example. In the same way as shown in FIG. 3A, a mask film 121, which can provide a process selection ratio with respect to a process object, is formed on the entire surface of a device substrate 10. The mask film 121 is a film that serves as a mask when the patterning region $R_P$ is subjected to patterning with a desired shape. The mask film 121 is formed of an organic film, such as an SOC film, for example.

Figure 4A:
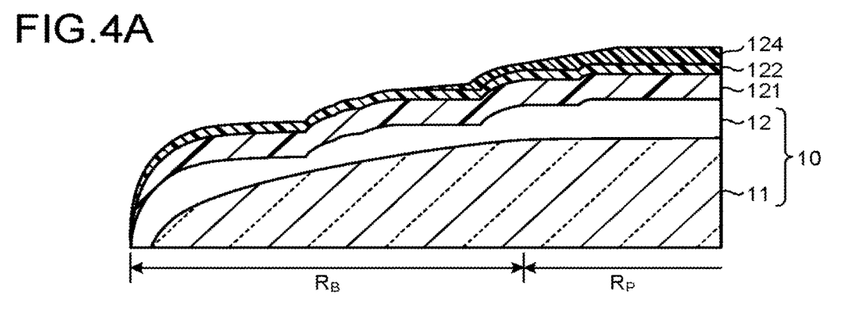
FIGS. 4A to 4E are partial sectional views schematically showing an example of the sequence of a pattern formation method according to a comparative example.

Then, as shown in FIG. 4A, planarization is performed to remove device step portions on the patterning region $R_P$ of the device substrate 10. In this example, a resist for the planarization is dropped onto the patterning region $R_P$, and a blank template, which does not include any rugged patterns, is placed adjacent to the upper surface of the patterning region $R_P$ with a predetermined distance therebetween. Thereafter, the resist is irradiated with light having a predetermined wavelength (such as ultraviolet rays), so that the resist is cured. Then, the blank template is separated, and so a resist pattern 124 including the upper surface of the patterning region $R_P$ thus planarized is formed.

However, according to the comparative example, since the mask film 121 is present also on the bevel region $R_B$, the resist leaks from the patterning region $R_P$ onto the bevel region $R_B$ during the imprint process. As a result, the film thickness of the resist becomes gradually smaller at the peripheral edge portion of the patterning region $R_P$. Thus, the patterning region $R_P$ ends up not being planarized over the entire region. Further, this resist leakage is not uniform over the entire periphery of the device, but is different in leakage degree depending on the place.

Figure 4B:
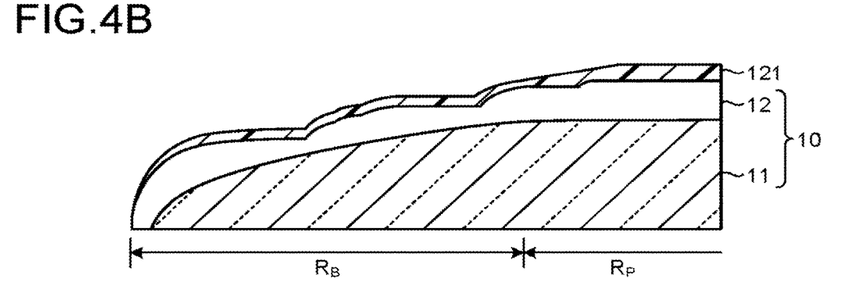

Thereafter, as shown in FIG. 4B, etching back is performed by use of dry etching. Consequently, the mask film 121 is etched by a predetermined thickness. In this case, since the thickness of the resist is smaller at the peripheral edge portion of the patterning region $R_P$, the thickness of the mask film 121 also becomes smaller at the peripheral edge portion of the patterning region $R_P$ after the etching back. As a result, the patterning region $R_P$ falls into a state not being planarized over the entire region. Further, since the mask film 121 is present continuously from the patterning region $R_P$ to the bevel region $R_B$, the upper surface of the bevel region $R_B$ has a small inclination angle of less than 10° with respect to the upper surface of the patterning region $R_P$. Further, since the resist leakage degree differs depending on the place as described above, the thickness of the mask film 121 is not uniform on the peripheral edge portion of the patterning region $R_P$ and the bevel region $R_B$.

Figure 4C:
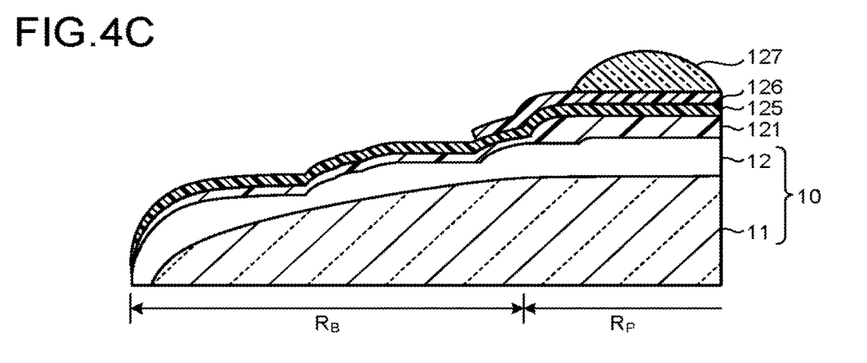
Figure 4D:
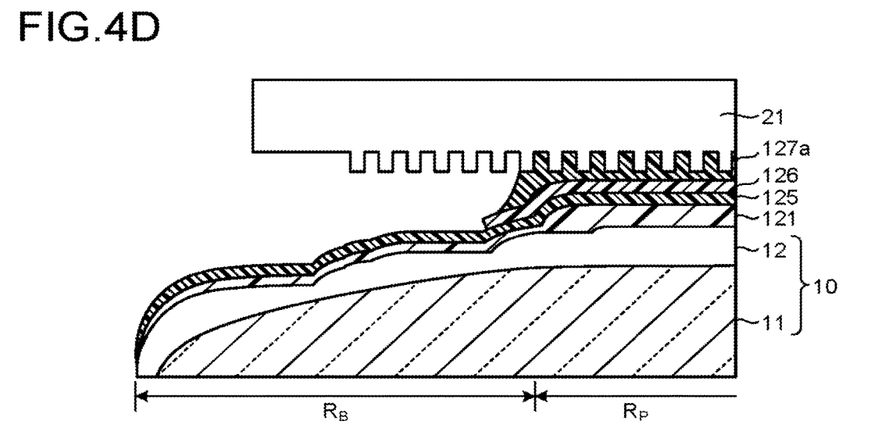

Then, as shown in FIG. 4C, an organic multilayer film 125 and an adhesion film 126 are applied onto the device substrate 10, and then a resist 127 is dropped onto the patterning region $R_P$ of the device substrate 10. Thereafter, as shown in FIG. 4D, a template 21 formed with rugged patterns is placed on a shot region of the patterning region $R_P$ including the resist 127 dropped thereon, such that there is a predetermined distance between the face formed with the rugged patterns of the template 21 and the upper surface of the device substrate 10. The predetermined distance is set to a certain distance or less, by which the resist 127 can come into contact with the template 21. Then, the shot region and the template 21 are more accurately positioned by use of die-by-die alignment.

Figure 4E:
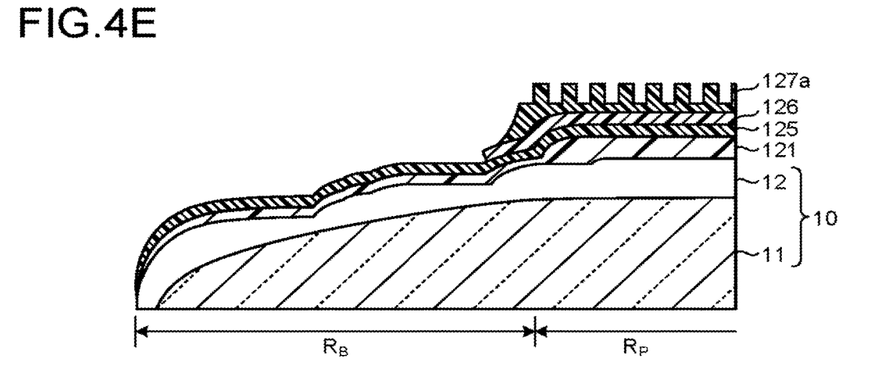

After the recessed portions of the template 21 are filled with the resist 127 by means of a capillary phenomenon, the resist 127 is irradiated with light having a predetermined wavelength, so that the resist 127 is cured. Then, as shown in FIG. 4E, the template 21 is separated, and resist patterns 127a are thereby formed. After the resist patterns 127a are formed on all the shot regions, patterning is performed to the mask film 121 by use of a dry etching method, through the resist patterns 127a serving as a mask. Further, etching is performed to a process object included in the multilayer film 12 by use of a dry etching method, through the patterned mask film 121 serving as a mask. As a result, the method of manufacturing a semiconductor device is completed.

During an imprint process, since the flatness of the bevel region $R_B$ is poor at imperfect shot areas and the upper surface of the bevel region $R_B$ has different heights (positions) at respective shot positions, a film thickness difference is generated in the thickness (RLT) of the resist pattern 127a between the template 21 and the device substrate 10.

Further, when the template 21 is moved in a lateral direction relative to the device substrate 10 during die-by-die alignment, the template 21 comes into contact with the mask film 121 having a non-uniform thickness on the peripheral edge portion of the patterning region $R_P$. As a result, a shear force is generated on the template 21 and the device substrate 10. Particularly, with a decrease in the RLT, the resist 127 comes to behave as an elastic body, and the shear force acting on the template 21 and the device substrate 10 becomes larger. Further, when the template 21 is inclined in accordance with the peripheral edge portion of the patterning region $R_P$ or the bevel region $R_B$ during an imprint process, there may occur a case that the end portion of the template 21 interferes with the bevel region $R_B$. The factors described above are combined, and thereby the overlay accuracy between the device substrate 10 and the template 21 ends up being deteriorated.

On the other hand, according to this embodiment, the mask film 121 is removed at part present on the bevel region $R_B$ of the device substrate 10, and the inclination angle of the upper surface of the bevel region $R_B$ with respect to the patterning region $R_P$ is set to 10° or more and 90° or less. Consequently, the surface constituting the bevel region $R_B$ is controlled to have approximately the same shape over the peripheral edge portion of the device substrate 10. As a result, it is possible to prevent the template 21 and the device substrate 10 from interfering with each other at imperfect shot areas. Further, since the flatness of the patterning region $R_P$ is improved in the planarization step of the patterning region $R_P$, non-uniformity of the RLT can be reduced. As a result, there is also provided an effect capable of reducing the shear force during die-by-die alignment and thereby improving the overlay accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a device substrate, the method comprising:
   forming a mask film on an entire surface of a device substrate in which a multilayer film is disposed on a substrate;
   removing a portion of the mask film on a bevel region that is provided as a region from a peripheral edge portion of a patterning region to an end portion of the device substrate, the patterning region being provided as the region on which a resist is to be applied during an imprint process of the device substrate; and planarizing an upper surface of the mask film positioned on the patterning region, wherein the planarizing of the upper surface of the mask film includes dropping the resist onto the mask film, placing a blank template including no rugged patterns, with respect to the mask film through the resist, such that there is a predetermined distance between the blank template and the mask film, and curing the resist, and etching back an entire surface of the device substrate by use of dry etching.

2. The method of manufacturing a device substrate according to claim 1, wherein the removing of the mask film is performed by use of a bevel CMP method, bevel RIE, Edge Bead Removal, or peripheral light exposure.

3. The method of manufacturing a device substrate according to claim 1, wherein the mask film is formed of a carbon film.

4. The method of manufacturing a device substrate according to claim 1, wherein the substrate is formed of a wafer.

5. The method of manufacturing a device substrate according to claim 4, wherein the wafer is formed of a semiconductor wafer, glass wafer, or ceramic wafer.

6. A method of manufacturing a semiconductor device, the method comprising:

forming a mask film on an entire surface of a device substrate in which a multilayer film is disposed on a substrate;

removing a portion of the mask film on a bevel region that is provided as a region from a peripheral edge portion of a patterning region to an end portion of the device substrate, the patterning region being provided as the region on which a resist is to be applied during an imprint process of the device substrate;

planarizing an upper surface of the mask film positioned on the patterning region;

dropping a first resist onto the mask film;

placing a first template formed with rugged patterns, with respect to the mask film through the first resist, such that there is a predetermined distance between the first template and the mask film, and curing the first resist and to form a resist pattern; and processing the multilayer film through the resist pattern serving as a mask.

7. The method of manufacturing a semiconductor device according to claim 6, wherein the planarizing of the upper surface of the mask film includes dropping a second resist onto the mask film, placing a blank template including no rugged patterns, with respect to the mask film through the second resist, such that there is a predetermined distance between the blank template and the mask film, and curing the second resist, and etching back the entire surface of the device substrate by use of dry etching.

8. The method of manufacturing a semiconductor device according to claim 6, wherein the removing of the mask film is performed by use of a bevel CMP method, bevel RIE, Edge Bead Removal, or peripheral light exposure.

9. The method of manufacturing a semiconductor device according to claim 6, wherein the mask film is formed of a carbon film.

\* \* \* \* \*